US011108027B2

United States Patent
Quinn et al.

(10) Patent No.: US 11,108,027 B2
(45) Date of Patent: Aug. 31, 2021

(54) PRINTED METAL GASKET (71) Applicant: Universal Display Corporation, Ewing, NJ (US)

(72) Inventors: William E. Quinn, Whitehouse Station, NJ (US); Jason Paynter, Bristol, PA (US); Gregory McGraw, Yardley, PA (US); Matthew King, Evesham, NJ (US)

(73) Assignee: Universal Display Corporation, Ewing, NJ (US)

( * ) Notice: Subject to any disclaimer, the term of this patent is extended or adjusted under 35 U.S.C. 154(b) by 344 days.

(21) Appl. No.: 16/245,517

(22) Filed: Jan. 11, 2019

(65) Prior Publication Data

US 2019/0214603 A1    Jul. 11, 2019

Related U.S. Application Data (60) Provisional application No. 62/615,993, filed on Jan. 11, 2018.

(51) Int. Cl.
H01L 51/56    (2006.01)
H01L 51/52    (2006.01)
H01L 51/00    (2006.01)

(52) U.S. Cl.
CPC .......... *H01L 51/56* (2013.01); *H01L 51/0022* (2013.01); *H01L 51/0029* (2013.01); *H01L 51/5246* (2013.01); *H01L 2251/105* (2013.01); *H01L 2251/56* (2013.01)

(58) Field of Classification Search
CPC ..................................................... H01L 51/56
See application file for complete search history.

(56) References Cited

U.S. PATENT DOCUMENTS

| | | |
|---|---|---|
| 4,140,323 A | 2/1979 | Jacobs |
| 4,769,292 A | 9/1988 | Tang |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 5,984,317 A | 11/1999 | Grant-Acquah |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |

(Continued)

FOREIGN PATENT DOCUMENTS

WO    2008057394 A1    5/2008
WO    2010011390 A2    1/2010

OTHER PUBLICATIONS

Baldo et al. Highly efficient phosphorescent emission from organic electroluminescent devices, Nature, vol. 395, pp. 151-154, 1998.

(Continued)

*Primary Examiner* — Marvin Payen
(74) *Attorney, Agent, or Firm* — Butzel Long (57) ABSTRACT

Techniques and devices are provided for attaching a die to a metal manifold. A metal-containing ink is used to deposit a metal trace on the die and thereby to form a gasket, after which the die is compressed against the manifold to form a sealed connection between the two.

12 Claims, 8 Drawing Sheets

(56) References Cited

U.S. PATENT DOCUMENTS

| | | |
|---|---|---|
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 8,117,749 B2 | 2/2012 | Nikamoto |
| 8,579,299 B2 | 11/2013 | Zhuang |
| 9,178,184 B2 | 11/2015 | McGraw |
| 2003/0230980 A1 | 12/2003 | Forrest |
| 2004/0174116 A1 | 9/2004 | Lu |
| 2015/0376787 A1 | 12/2015 | McGraw |
| 2017/0229663 A1 | 8/2017 | Tsai |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

PRINTED METAL GASKET

CROSS-REFERENCE TO RELATED APPLICATIONS

This application is a non-provisional and claims the priority benefit of U.S. Patent Application Ser. No. 62/615,993, filed Jan. 11, 2018, the entire contents of which are incorporated herein by reference.

FIELD

The present invention relates to systems and techniques for printing a metal gasket for use in devices for fabricating organic light emitting diodes, and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, a method of fabricating a device comprising a die and a metal manifold is provided, in which a metal-containing ink is deposited in one or more traces around one or more vias on a die to form a gasket. The gasket is then placed in direct physical contact with a metal manifold to which the die is to be sealed and compressed against the metal manifold to form a sealed connection between the one or more vias and one or more corresponding channels in the metal manifold. The traces may form a closed contour around at least one of the one or more vias. The die may include multiple vias, and the method may further include depositing a plurality of non-intersecting traces including the one or more traces, each trace of the plurality of traces deposited around one or more of the plurality of vias. Alternatively, the traces may be deposited such that at least two of the plurality of traces intersect. The metal-containing ink may include one or more compounds such as a suspension of metallic nanoparticles in an organic solvent; and a solution of organometallic precursors. The metal may be, for example, silver, gold, copper, and/or titanium. The gasket may be placed to an accuracy of less than 10 µm and the gasket may have a thickness of not more than 100 µm.

According to an embodiment, a device is provided that includes a manifold and a die comprising one or more vias, with a metal gasket disposed on and non-removably attached to a surface of the die around the one or more vias, deposited via a metal-containing ink. The gasket removably connects the die to the metal manifold. The gasket may include one or more closed contour(s) around the one or more vias, which may be intersecting or non-intersecting. The die may be removable from the manifold solely by removal of a compressive force that removably attaches the gasket and die to the manifold.

According to an embodiment, a method of attaching two components via metal gasket is provided that includes depositing a metal-containing ink on a first component of a device to form a gasket, placing the gasket in direct physical contact with a second component of a device to which the first component is to be attached, and applying a compressive force to the first component against the second component to form a sealed connection between the first component and the second component. The first component may be removable from the second component solely by removal of the compressive force.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
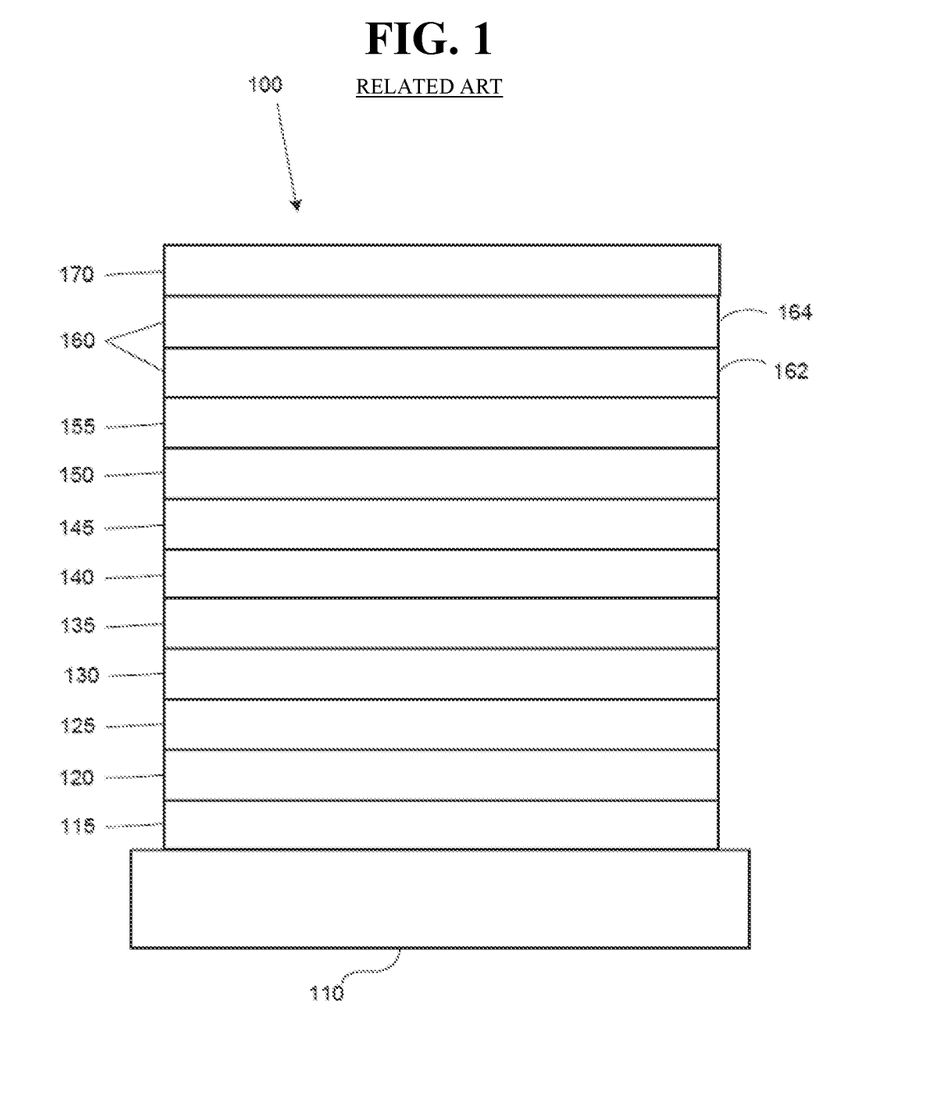
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat.

Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
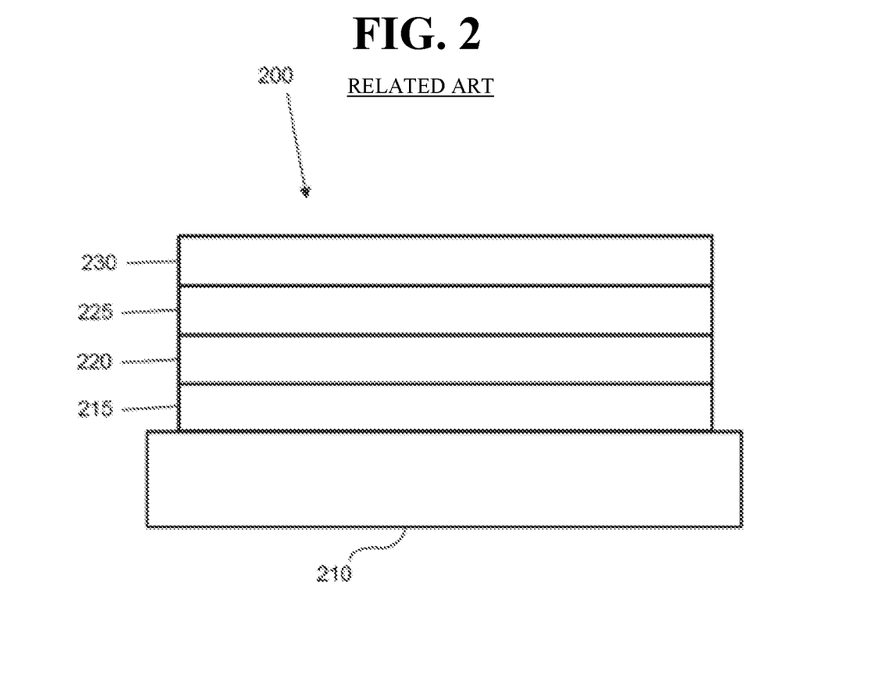
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In general, the various layers of OLEDs and similar devices described herein may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Some OLED structures and similar devices may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials, structures, and techniques described herein may have applications in devices other than the fabrication of OLEDs. For example, other optoelectronic devices such as organic solar cells and organic photodetectors may employ or be fabricated by the materials, structures, and techniques. More generally, organic devices, such as organic transistors, may employ the materials, structures, and techniques.

An OLED fabricated using devices and techniques disclosed herein may have one or more characteristics selected from the group consisting of being flexible, being rollable, being foldable, being stretchable, and being curved, and may be transparent or semi-transparent. In some embodiments, the OLED further comprises a layer comprising carbon nanotubes.

In some embodiments, an OLED fabricated using devices and techniques disclosed herein further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

An OLED fabricated according to techniques and devices disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, OLEDs and other similar devices may be fabricated using a variety of techniques and devices. For example, in OVJP and similar techniques, one or more jets of material is directed at a substrate to form the various layers of the OLED.

Figure 3:
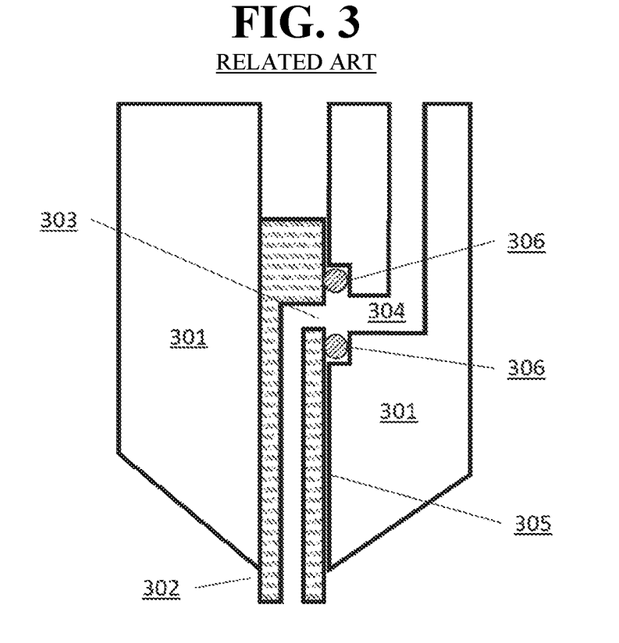
FIG. 3 shows a cross-section of an illustrative OVJP print head containing a micronozzle die sealed to a die clamp using conventional arrangements.

A print head of a conventional OVJP tool generally includes a micronozzle array contained within a silicon die, with a metal clamp surrounding it. FIG. 3 shows an example of such a device. In this configuration, the sides of the clamp 301 compress the die 302 and hold it in place. Organic vapor is fed into and/or drawn from the micronozzle array through one or more vias 303 on the flat surface of the die, which are in fluid communication with machined channels 304 on one or both faces of the clamp, as shown. The faces of the clamp 305 may be ground and polished to minimize leakage of gas between the faces of the clamp and the faces of the die. However, this is not always sufficient to produce an acceptably fluid-tight seal. In some cases, the faces may also be machined with glands for use with elastomeric O-rings 306 or similar structures. These may create a better seal than the machined and polished faces alone, but concerns about outgassing and thermal degradation of the gasket material generally limit the usefulness of O-rings in OVJP and other applications, especially for use in fabricating organic devices as disclosed herein. Deformable metal gaskets may be used in place of the elastomeric O-rings. However, such gaskets typically are not commercially available at the scale needed for OVJP and similar deposition systems. Furthermore, even if or when such gaskets are available, a conventional metal gasket generally would require a high sealing pressure that would be likely to damage the MEMS die.

It has therefore been found that designing an interface for micronozzle arrays used in OVJP and similar systems presents unique challenges beyond those normally encountered when integrating microfluidic components into larger systems. Specifically, the interface that joins the silicon die containing the OVJP or other micronozzle array to a source of organic vapor or other material to be deposited on a substrate should be capable of forming a gas-tight seal at temperatures of up to 350 C, without outgassing when subjected to operational temperatures in that range for potentially long periods of time.

To address these needs, embodiments disclosed herein provide techniques and devices for sealing a die containing microfluidic elements to a metal manifold, which may be suitable for use in fabricating OVJP nozzle blocks and other devices for deposition of materials on a substrate. According to embodiments disclosed herein, a gasket may be formed on the flat face of a die by depositing traces of ink, which contain metal particles in suspension, in one or more closed contours around one or more regions to be sealed to a manifold. A variety of printing techniques may be used to generate the traces. After the traces are dried and/or sintered, they may provide a deformable metal gasket capable of sealing the die and manifold, while also withstanding relatively high temperatures without outgassing.

Figure 4A:
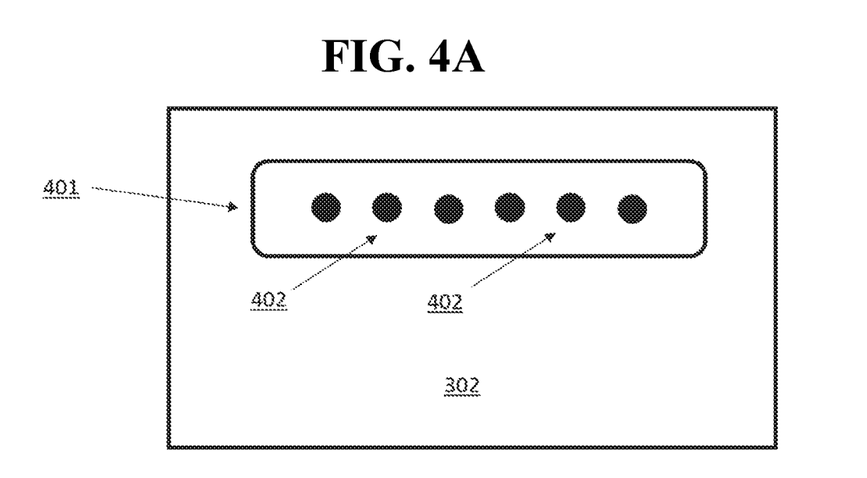
FIG. 4A shows an example of a joining surface of a die featuring a printed metal gasket according to an embodiment disclosed herein.

An example of a gasket pattern trace according to an embodiment is shown in FIG. 4A. Prior to installation of a die into an associated clamp, such as die 302 and clamp 301 shown in FIG. 3, a pattern of a desired gasket is drawn on a face of the die using an ink that forms a metal deposit upon drying and/or firing. In this example, the trace includes a closed contour 401 that is wide enough to enclose both the vias 402 on the die as well as the channels on the face of the clamp manifold to which the die is to be attached that correspond to the vias 402. The metal-containing ink may be deposited by a variety of methods including inkjet processes, screen printing, and the like. Ink-containing noble metals like silver and gold typically are preferred, because noble metals are both soft and chemically non-reactive, though alloys and other materials also may be used. The ink is often a suspension of metallic nanoparticles in an organic solvent. After deposition on the desired trace or traces, the metal-containing ink may be baked or otherwise processed to evaporate the solvent in the ink, leaving behind the desired metal gasket. Alternately or in addition, a solution of organometallic precursors that react to leave a metal film may be used as the metal-containing ink instead of a suspension of metal nanoparticles.

The metal gasket may be considered to be "non-removably" attached to the die. That is, it may not be possible to remove the gasket from the die without damaging the die or causing modifications that would require the die to be refurbished before being used again with the same or a different manifold. Similarly, it may be unlikely or impossible for the gasket to move on the surface of the die between deposition on the die and placement of the die relative to the manifold.

Once the metal gasket is set on the face of the die, a seal may be formed by compressing the die with the clamp. A schematic view of such an arrangement is shown in cross-section in FIG. 4B. The metal gasket 403 may be wetted to the die at its base 404. The opposite surface of the thickest portion of the gasket may deform slightly due to pressure from the clamp. The thin, soft metal of the gasket provides a seal between the surfaces of the die and the clamp that requires relatively little pressure. Due to the presence of the metal gasket, gas or other fluid materials can be exchanged between vias on the die and a manifold of channels inside the clamp without leaking into the surrounding environment.

In contrast to the non-removable attachment of the gasket to the die, the gasket (and thus the die) may be removably attached to the manifold. The gasket may be considered "removably" attached when it is possible to remove the gasket from the manifold without damaging the manifold, or otherwise requiring refurbishment or modification of the manifold after removal of the die before it is used with a subsequent die. In some cases, the gasket (and therefore the die) may be removed from the manifold merely by removing the compressive force used to attach the gasket and die to the manifold. Accordingly, embodiments disclosed herein may be used in devices and systems where the die is considered a consumable or semi-consumable component.

Figure 5A:
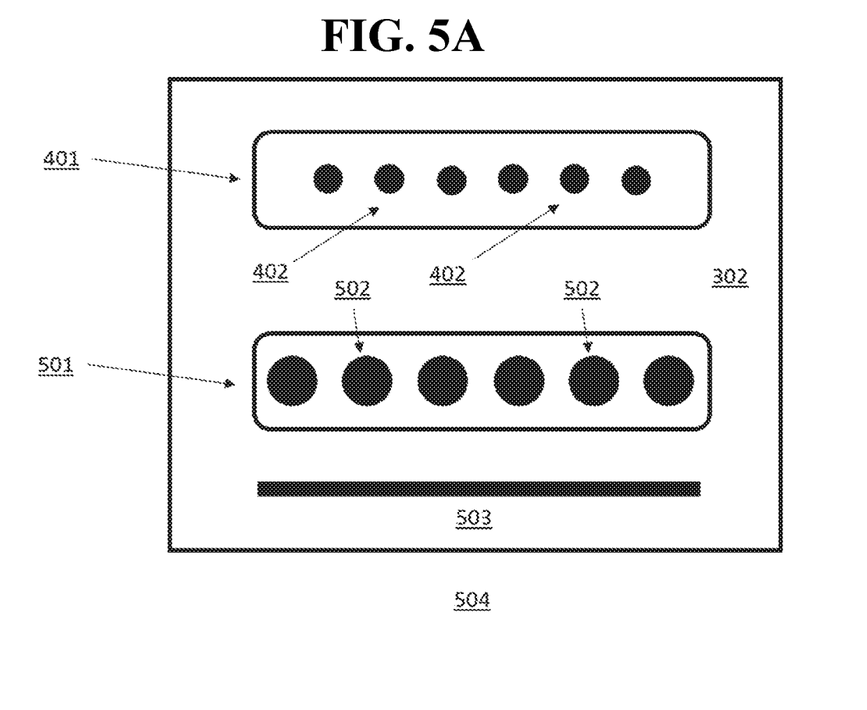
FIGS. 5A, 5B, and 5C show examples of multiple metal traces forming gasket seals on the surface of a die according to an embodiment disclosed herein.

In an embodiment, multiple banks of one or more vias may be enclosed in separate and non-intersecting metal contours so that they are sealed both from each other and the environment around the joint between the die and the manifold. An example of such a layout is shown in FIG. 5. In this example, a first contour 401 of printed metal surrounds a first bank of vias 402 as previously disclosed. A second contour of printed metal 501 similarly surrounds a second bank of vias 502.

In some embodiments, printed metal traces may not be closed contours. For example, one or more metal traces may be placed so as to distribute force from the clamp, improve heat transfer between the die and clamp, or serve similar purposes that may not require surrounding one or more vias between the die and the manifold. For example, a wide line of printed metal 503 may be placed along a lower edge of a die 504 where a microarray of depositors is located. The line of gasket material may improve heat transport to the die and/or provide additional mechanical stability. Such a line may be deposited at the same time as one or more contours that surround vias in the die, allowing for greater manufacturing and assembly options and efficiency.

In some embodiments, multiple concentric contours of gasket material may be used to create redundant seals around one or more vias. An example of such an arrangement is shown in FIG. 5B, where multiple, non-intersecting metal traces 510, 511 surround a single set of vias 515.

In some embodiments, multiple overlapping traces may be used. Such a configuration is shown in FIG. 5C. In this arrangement, three sets of vias 517, 518, 519 on the die 504 are surrounded by various combinations of two traces 520, 522 that form two separate but overlapping gaskets. Vias 517 and 519 are surrounded only by one trace 520, 522, respectively, while vias 518 are surrounded by both traces 520, 522. The traces 520, 522 overlap as shown. Such configurations may be desirable, for example, when different combinations of metal-containing inks, trace thicknesses, metals, gasket thicknesses, or other process parameters are desired. Such configurations also may be desirable where traces are intended to serve multiple purposes, such as providing various gasket arrangements as well as structural enhancements as disclosed with respect to FIG. 5A. More generally, any combination of overlapping and/or non-overlapping traces may be used to form any desired arrangement of gaskets or structural components. Similarly, any desired number or arrangement of vias may be surrounded by any desired number or arrangement of traces and corresponding gaskets.

Figure 5B:
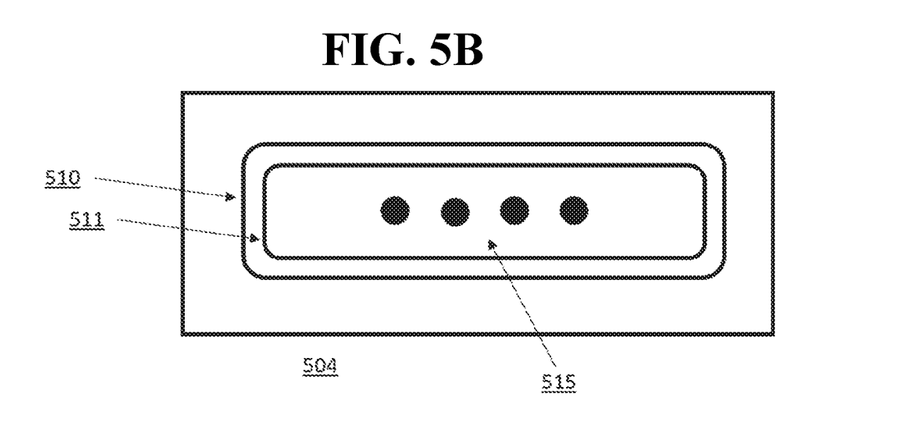
Figure 5C:
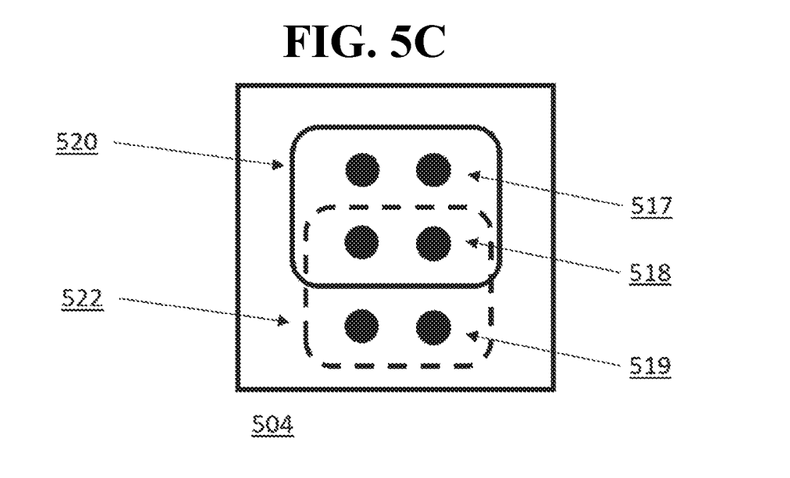

Although the examples in FIGS. 5A-5C show uniform traces, any shape or arrangement of one or more traces may be used to form the gaskets disclosed herein. That is, traces may be rectangular, oval, circular, elliptical, or any irregular shape. The specific shape for a particular trace may be selected based upon the arrangement of vias the trace is intended to surround, ease of deposition, and/or structural considerations as previously disclosed.

Figure 4B:
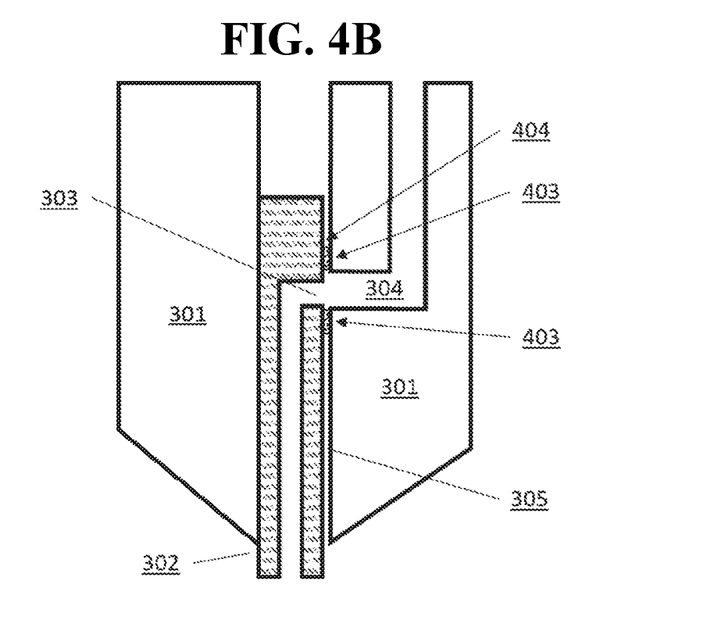
FIG. 4B shows a cross section of a micronozzle array sealed to a die clamp using a printed metal gasket according to an embodiment disclosed herein.

Any trace arrangement, including those such as described with respect to FIG. 4 and FIGS. 5A-5C, may be used to form a device that includes a die and a metal manifold as shown in FIG. 4B. That is, after metal-containing ink is deposited on a trace (or traces) around one or more vias to form a gasket on the die, the gasket may be placed in direct physical contact with the metal manifold to which the die is to be sealed. The die is then compressed against the manifold, forming a sealed connection between the die and the manifold and, more specifically, a sealed connection between the via(s) and corresponding channels in the manifold.

Additional steps may be added to this basic process as desired or necessary for a specific application, or to achieve specific process parameters. For example, mechanical properties of the gasket may be improved by sintering. As a specific example, sintering of gold or silver nanoparticles tends to occur at relatively low temperatures below 300 C, so it is a likely side effect of any post-deposition bake process. Sintering may make the gasket more malleable and ductile so that it performs more like a conventional metal gasket. Sintering also may reduce the porosity of the gasket and therefore slow the rate at which material can diffuse through it. The sintering may be performed in any suitable environment or atmospheric conditions, including a vacuum or partial vacuum, an inert gas atmosphere, a reducing atmosphere, or an oxygen-containing atmosphere.

Figure 6:
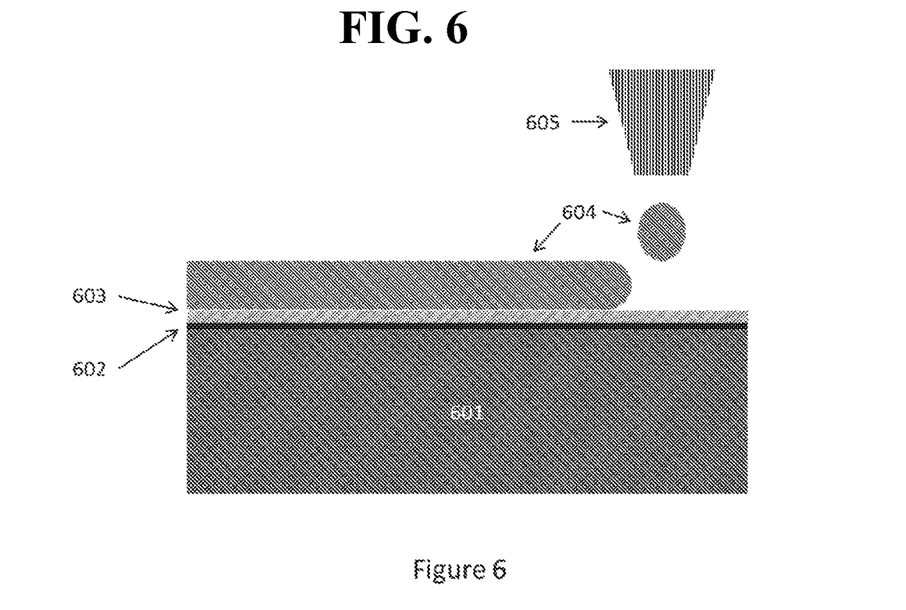
FIG. 6 shows an example of a Si die with a printed metal gasket in cross-section, illustrating thin film layers for adhesion promotion according to an embodiment disclosed herein.

As another example, one or more thin films may be deposited on the surface of the die prior to printing the gasket. This may promote adhesion between the die and the gasket material. As a specific example, organic materials such as HMDS may be used to clean the surface and modify its surface energy, which improves adhesion during the initial wet printing process. As another example, evaporated titanium or chromium films may be used as adhesion layers between noble metals and a silicon substrate. Such metals readily oxidize, so it may be desirable to cap or otherwise coat such films with a noble metal prior to printing the gasket material. The printed gasket material then may bond to this layer as it sinters. An example of such a structure is shown in FIG. 6. The Si die 601 forms the substrate of the structure. An adhesion layer 602 and a capping layer 603 may be deposited over the substrate, such as by e-beam evaporation or any other suitable technique. The adhesion layer may include, for example, a layer of 200 Å Ti. The capping layer may include, for example, a 500 Å Au layer. A metal trace 604 as previously disclosed may then be deposited over the capping layer by an inkjet nozzle 605. The trace layer may include, for example, a 10 μm thick film of gold nanoparticles in suspension.

As another example, the metal-containing ink formulation may contain flux that reacts with oxides when heated to ensure a sufficient bond between the die and the gasket metal. Fluxes may attack native oxides on the substrate directly or they may require an additional adhesion layer. Activation of such fluxes generally requires temperatures higher than those typically used for sintering processes. Sintering may then be performed in a vacuum or an inert gas atmosphere to inhibit oxidation. A reducing atmosphere containing forming gas may also be used. Conversely, oxygen may be desired to ash surfactants present in the metal particle suspension. Thermal treatment of the metal gasket may be done in multiple steps under multiple types of atmosphere. Thermal processing is normally done between deposition of the gasket and installation of the die in the clamp.

Figure 7A:
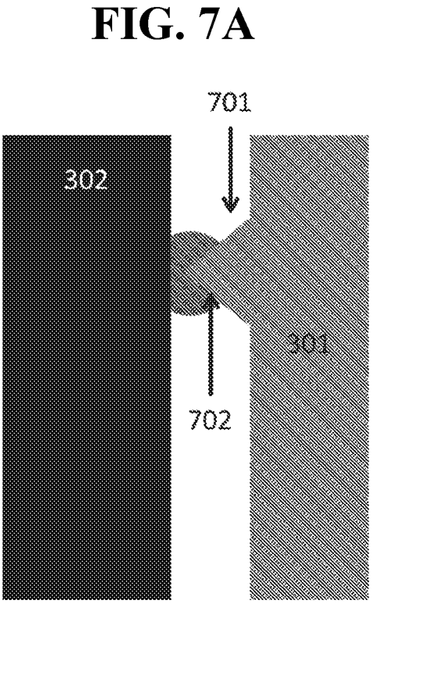
FIGS. 7A and 7B show cross sections of example gland designs on a clamp surface suitable for use with printed metal gaskets according to embodiments disclosed herein.
Figure 7B:
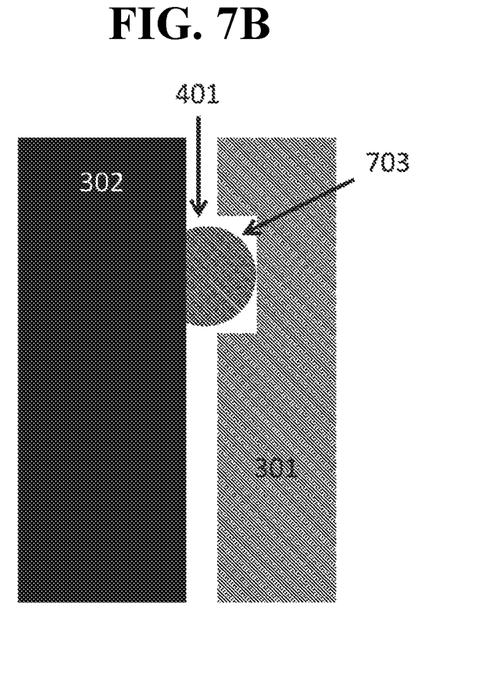

In some embodiments, topographic features may be added to the face of the clamp to enhance sealing. For example, a pointed or convex surface 701 may act as a knife edge to create a seal by creating a narrow deformation in the gasket 702 as shown in FIG. 7A. If the "knife edge" is sufficiently narrow or shallow, the arrangement may not create excessive stress on the die material underlying the gasket. Alternately, an indented feature 703 similar to an O-ring groove may be used instead, as shown in FIG. 7B. In some embodiments, printed metal gasket traces also may be deposited on the face of the clamp in addition to those on the die.

Embodiments disclosed herein differ from conventional die attachment methods in which solder may be printed on one of two components to be joined because the solder must wet to both sides of the assembly in die attachment, oven brazing, or similar techniques. In contrast, in embodiments disclosed herein each printed metal gasket only adheres to one of the two components, and is sealed to the mating surface of the opposite part by compression only. For example, in the embodiments previously disclosed, the printed metal gasket is only attached initially to the die and may be readily removed from the manifold by simple removal of the compressive force used to attached the die and gasket structure to the manifold. Accordingly, the resulting joint can be readily assembled and disassembled.

Embodiments disclosed herein may allow for extremely precise placement of metal gaskets because the gasket material is deposited directly on the die and, in general, is not subject to movement relative to the die between deposition and joining of the die to the manifold. As a specific example, embodiments disclosed herein may allow for placement of the gasket to within an accuracy of 10 μm or less. In contrast, conventional techniques often are relatively inaccurate due to potential movement of the gasket between placement and joining of the die and the manifold. Notably, embodiments disclosed herein may achieve this high accuracy even without the use of a pre-machined groove in the die or similar structure, since the gasket may be deposited non-removably directly on the die.

Embodiments disclosed herein also may allow for extremely thin gaskets that would not be achievable using conventional techniques. For example, gaskets as disclosed herein may be 1000 μm, 500 μm, 200 μm, 100 μm, 50 μm, 30 μm, or less in thickness. Any thickness gasket may be created using the techniques disclosed herein, up to the roughness tolerance(s) of the components being connected (e.g., the die and the manifold). Conventional techniques typically require much thicker gaskets or other components. For example, many conventional elastomeric O-rings and similar components would not be usable at the scales enabled by embodiments disclosed herein, as they would be damaged or destroyed during any placement process. As a specific example, a 100 μm O-ring likely would be torn or otherwise damaged by any device that attempted to place and hold the O-ring in place against a silicon die due to the thinness of the O-ring.

Embodiments disclosed herein also may eliminate more impurities, and may eliminate them more easily, than conventional techniques may achieve since they do not require other contact with the gasket. Once a gasket is printed on a die as disclosed herein, it may be non-removably attached to the die and thus may not shift in position on the die as the die is manipulated. In contrast, conventional O-rings and similar components are likely to shift, and therefore require movement before the die is attached to the manifold. Such additional placement is likely to introduce impurities, for example due to handling of an elastomeric or metal O-ring.

Embodiments disclosed herein may be usable in environments and systems that are not suitable, or less than well-suited, for the use of elastomeric or metal O-rings or similar gaskets. For example, embodiments disclosed herein may be particularly well-suited for high-temperature applications as previously disclosed, in which elastomeric O-rings would degrade or fail. Conventional metal gaskets such as C-rings and compression gaskets, while suitable for use in some high-temperature environments, often are not suitable for MEMS-type devices such as OVJP nozzle blocks, in which a silicon or silicon-based die is used.

While embodiments and examples provided herein are described with respect to illustrative OVJP uses, the scope and content of the invention is not so limited. Embodiments disclosed herein may be applied more generally to any applications that require or benefit from a non-outgassing, high temperature seal between consumable and reusable components. A metal gasket may be printed on the consumable component as disclosed herein, allowing it to seal to a permanent part of an assembly on installation and then be easily removed and replaced when needed as previously disclosed.

EXPERIMENTAL

Metalon™ JS-B40G silver inkjet metal-containing ink provided by Novacentrix (Austin, Tex.) was used to fabricate and examine arrangements disclosed herein. Silver loading was 40% by weight. It was dispensed with a Fujifilm Dimax inkjet printer. The die was baked for 1 hr on a hot plate at 300 C after printing. All processing was done in an N2 glovebox with O2 and H2O concentrations of less than 10 ppm.

Figure 8A:
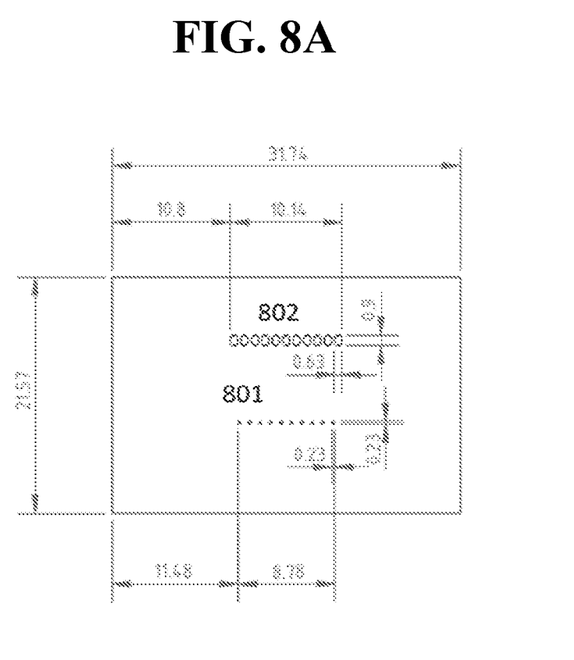
FIGS. 8A and 8B show a dimensioned drawing a die containing a micronozzle array for use with printed metal gaskets according to an embodiment disclosed herein.
Figure 8B:
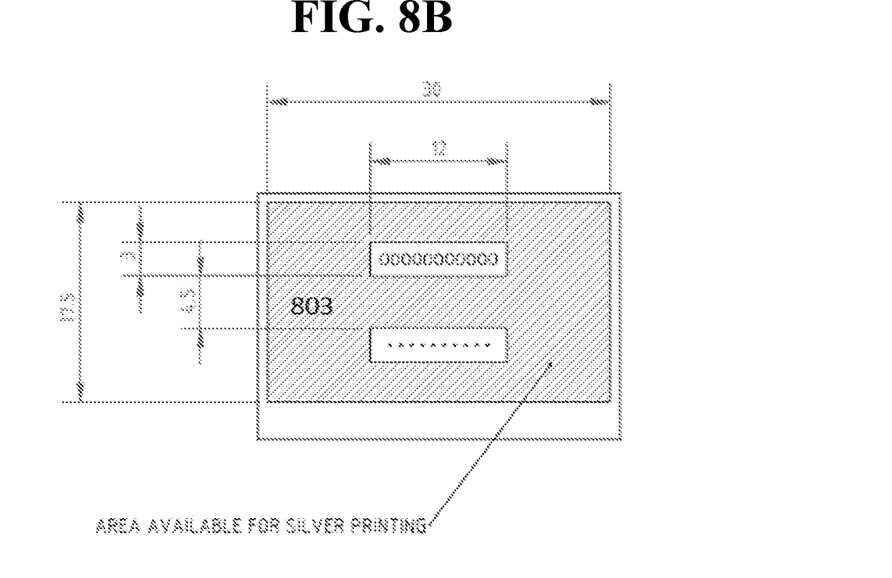

A dimensioned drawing of a die containing a micronozzle array is shown in FIGS. 8A and 8B. FIG. 8A shows the die with two discrete banks of vias, 801 and 802. The regions around the array available for gasket printing 803 are identified in FIG. 8B.

Figure 9:
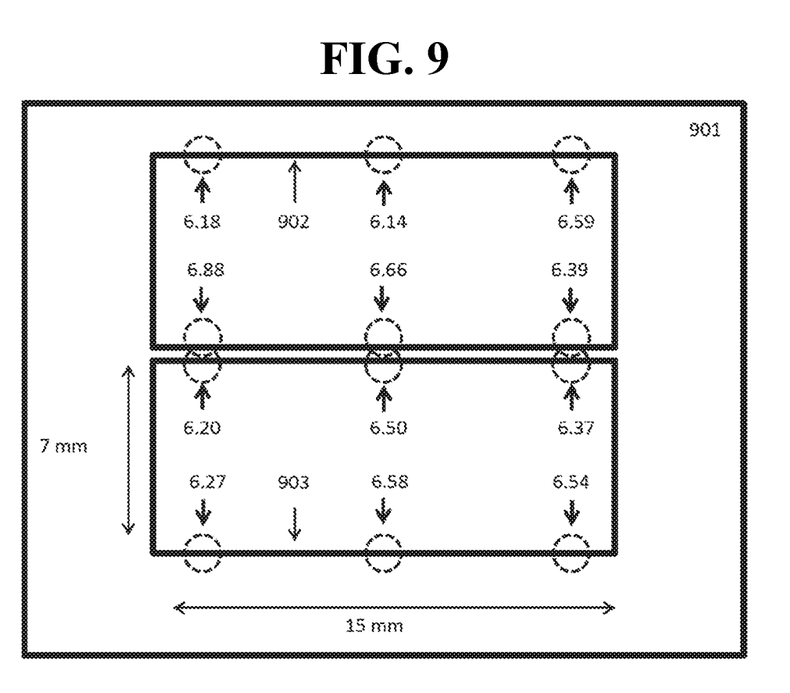
FIG. 9 shows the path and thickness of a silver gasket printed on a die according to an embodiment disclosed herein.

FIG. 9 shows a pattern of metal printed on an experimental die 901. Two closed rectangular contours 902, 903 of 15 mm in width and 7 mm in height were printed. The lines of gasket material are 0.25 mm in width. The height of the gasket is defined as the maximum thickness of the printed material measured perpendicular to the trace by a stylus profilometer. The height was measured at 6 equidistant points around each of the two contours. The measured values at each measurement point are shown on FIG. 9 in microns. The average thickness of the gasket material is 6.44 μm high with a standard deviation of 0.22 μm. The relatively small variation in height indicates that the gasket can be readily compressed to provide a uniform seal. The RMS roughness of the gasket surface is 95 nm.

Figure 10:
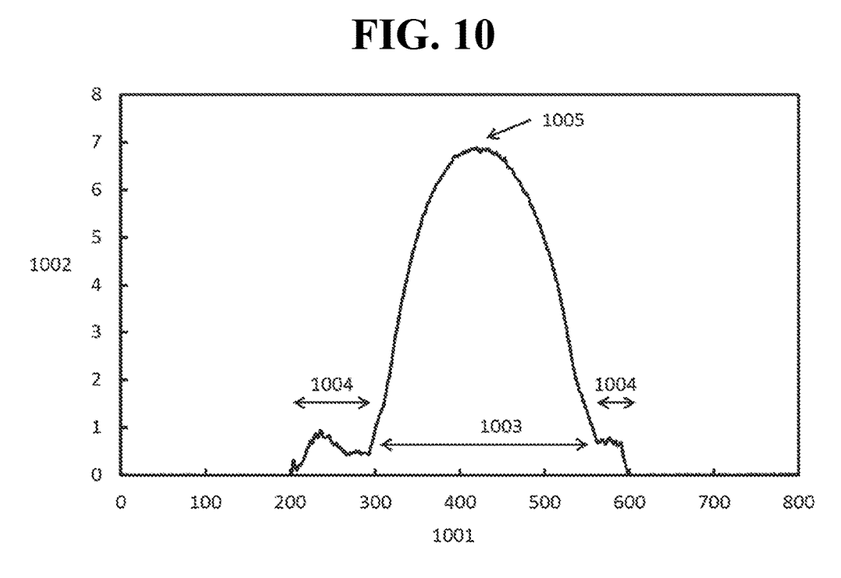
FIG. 10 shows the cross-sectional thickness profile of a printed metal gasket on a die according to an embodiment disclosed herein.

An example of a cross sectional profile from a printed seal is plotted in FIG. 10. The horizontal axis 1001 gives distance along an axis perpendicular to the trace and the vertical axis 1002 gives thickness, both in microns. The main body of the seal is 250 μm wide 1003, with thinner shoulders of 50 to 100 μm in width on each side. The height of the gasket, as indicated by the thickest point 1004 is 6.88 μm. Printing may be performed in multiple passes and/or dithered in a direction orthogonal to the trace to control the height and thickness profile of the gasket.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method of fabricating a device comprising a die and a metal manifold, the method comprising:
   depositing a metal-containing ink in one or more traces around one or more vias on a die to form a gasket;
   placing the gasket in direct physical contact with a metal manifold to which the die is to be sealed; and
   compressing the die against the metal manifold to form a sealed connection between the one or more vias and one or more corresponding channels in the metal manifold.

2. The method of claim 1, wherein each of the one or more traces form a closed contour around at least one of the one or more vias.

3. The method of claim 1, wherein the die comprises a plurality of vias including the one or more vias, and wherein the method further comprises:
   depositing a plurality of non-intersecting traces including the one or more traces, each trace of the plurality of traces deposited around one or more of the plurality of vias.

4. The method of claim 1, wherein the die comprises a plurality of vias including the one or more vias, and wherein the method further comprises:
   depositing a plurality of traces including the one or more traces, each trace of the plurality of traces deposited around one or more of the plurality of vias, wherein at least two of the plurality of traces intersect.

5. The method of claim 1, wherein the metal-containing ink comprises a compound selected from the group consisting of: a suspension of metallic nanoparticles in an organic solvent; and a solution of organometallic precursors.

6. The method of claim 5, wherein the metal-containing ink comprises at least one metal selected from the group consisting of: silver, gold, copper, titanium.

7. The method of claim 5, wherein the step of depositing the metal-containing ink comprises a process selected from the group consisting of: inkjet printing, screen printing, and imprinting.

8. The method of claim 1, further comprising:
   subsequent to depositing the metal-containing ink on the die, sintering a metal resulting from deposition of the metal-containing ink on the die.

9. The method of claim 1, further comprising:
   prior to depositing the metal-containing ink on the die, depositing one or more thin films on the die in the region on the one or more traces.

10. The method of claim 1, wherein at least one trace of the one or more traces is a non-uniform shape.

11. The method of claim 1, wherein the gasket is placed at a position on the die to an accuracy of 10 μm or less.

12. The method of claim 1, wherein the gasket has a thickness of not more than 100 μm.

* * * * *